(12) United States Patent
Iwasaki

(10) Patent No.: US 6,833,595 B1
(45) Date of Patent: Dec. 21, 2004

(54) SEMICONDUCTOR DEVICE HAVING AN IMPROVED LAYOUT PATTERN OF PAIR TRANSISTORS

(75) Inventor: Ritsuko Iwasaki, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/496,421

(22) Filed: Feb. 2, 2000

(30) Foreign Application Priority Data

Feb. 2, 1999 (JP) .......................................... 11/024705

(51) Int. Cl.⁷ ............................................. H01L 29/76
(52) U.S. Cl. ........................ 257/401; 257/48; 257/206
(58) Field of Search ......................... 257/401, 48, 206; 438/11, 14

(56) References Cited

U.S. PATENT DOCUMENTS

| | | | | |
|---|---|---|---|---|
| 5,336,624 A | * | 8/1994 | Walden ........................ | 437/29 |
| 5,410,161 A | * | 4/1995 | Narita .......................... | 257/41 |
| 5,441,916 A | * | 8/1995 | Motonami ................... | 438/620 |
| 5,493,135 A | * | 2/1996 | Yin .............................. | 257/202 |
| 5,598,010 A | * | 1/1997 | Uematsu ...................... | 257/48 |
| 5,701,021 A | * | 12/1997 | Yin .............................. | 257/203 |
| 5,767,542 A | * | 6/1998 | Nakamura ................... | 257/296 |
| 5,847,381 A | * | 12/1998 | Isogai ....................... | 250/208.1 |
| 5,929,528 A | * | 7/1999 | Kinugawa ................... | 257/776 |
| 5,932,900 A | * | 8/1999 | Lin et al. ..................... | 257/202 |
| 5,946,563 A | * | 8/1999 | Uehara et al. ............... | 438/183 |
| 5,952,698 A | * | 9/1999 | Wong et al. ................. | 257/401 |
| 5,977,595 A | * | 11/1999 | Ham .......................... | 257/358 |
| 5,986,283 A | * | 11/1999 | Bush et al. .................... | 257/48 |
| 6,066,866 A | * | 5/2000 | Omori ........................ | 257/202 |
| 6,110,771 A | * | 8/2000 | Ahn ........................... | 438/200 |
| 6,140,686 A | * | 10/2000 | Mizuno et al. ............. | 257/202 |
| 6,174,741 B1 | * | 1/2001 | Hansch et al. ................ | 438/14 |
| 6,218,262 B1 | * | 4/2001 | Kuroi et al. ................. | 438/401 |
| 6,261,883 B1 | * | 7/2001 | Koubuchi et al. ........... | 438/197 |
| 6,287,902 B1 | * | 9/2001 | Kim ........................... | 438/183 |

FOREIGN PATENT DOCUMENTS

| | | | | |
|---|---|---|---|---|
| JP | 2-121366 | | 5/1990 | |
| JP | 2-246373 | | 10/1990 | |
| JP | 03105963 | * | 5/1991 | ................. 257/557 |
| JP | 10-200109 | | 7/1998 | |
| JP | 10200109 | * | 7/1998 | |
| JP | 2000200882 | * | 7/2000 | |

* cited by examiner

Primary Examiner—Tom Thomas
Assistant Examiner—Eugene Lee
(74) Attorney, Agent, or Firm—McGinn & Gibb, PLLC

(57) ABSTRACT

In a semiconductor device in which first and second transistors are configured so as to have the same electric characteristics as each other, a dummy gate is arranged between the first and second transistors in parallel to gates of the first and second transistors, and arrangement of source and drain regions formed on both sides of the gate of the first transistor, and arrangement of source and drain regions formed on both sides of the gate of the second transistor are the same as each other.

6 Claims, 6 Drawing Sheets

Fig.4

[TABLE 1] EXPECTED W=10 μm
DISPERSION(ΔW=0.2 μm)
<AS ESTIMATED>

| NUMBER OF GATES | (a) MASK-DESIGN VALUE | (b) DISPERSION (ΔW) | (c) ACTUAL GATE WIDTH | (d) SUM OF ACTUAL GATE WIDTHS |
|---|---|---|---|---|
| 1 | 10.2 | 0.2 | 10 | 10 |
| 2 | 5.2 | ↓ | 5 | 10 |
| 3 | 3.54 | ↓ | 3.34 | 10.02 |
| 4 | 2.7 | ↓ | 2.5 | 10 |
| 5 | 2.2 | ↓ | 2 | 10 |
| 6 | 1.87 | ↓ | 1.67 | 10.02 |

[TABLE 2] EXPECTED W=15 μm
DISPERSION(ΔW=0.2 μm)
<AS ESTIMATED>

| NUMBER OF GATES | (a) MASK-DESIGN VALUE | (b) DISPERSION (ΔW) | (c) ACTUAL GATE WIDTH | (d) SUM OF ACTUAL GATE WIDTHS |
|---|---|---|---|---|
| 1 | 15.2 | 0.2 | 15 | 15 |
| 2 | 7.7 | ↓ | 7.5 | 15 |
| 3 | 5.2 | ↓ | 5 | 15 |
| 4 | 3.96 | ↓ | 3.76 | 15.04 |
| 5 | 3.2 | ↓ | 3 | 15 |
| 6 | 2.7 | ↓ | 2.5 | 15 |

[TABLE 3] EXPECTED W=10 μm
DISPERSION(ΔW=0 μm)
<ESTIMATION ΔW-0.2μm>

| NUMBER OF GATES | (a) MASK-DESIGN VALUE | (b) DISPERSION (ΔW) | (c) ACTUAL GATE WIDTH | (d) SUM OF ACTUAL GATE WIDTHS |
|---|---|---|---|---|
| 1 | 10.2 | 0 | 10.2 | 10.2 |
| 2 | 5.2 | ↓ | 5.2 | 10.4 |
| 3 | 3.54 | ↓ | 3.54 | 10.64 |
| 4 | 2.7 | ↓ | 2.7 | 10.8 |
| 5 | 2.2 | ↓ | 2.2 | 11 |
| 6 | 1.87 | ↓ | 1.87 | 11.22 |

[TABLE 4] EXPECTED W=15 μm
DISPERSION(ΔW=0 μm)
<ESTIMATION ΔW-0.2μm>

| NUMBER OF GATES | (a) MASK-DESIGN VALUE | (b) DISPERSION (ΔW) | (c) ACTUAL GATE WIDTH | (d) SUM OF ACTUAL GATE WIDTHS |
|---|---|---|---|---|
| 1 | 15.2 | 0 | 15.2 | 15.2 |
| 2 | 7.7 | ↓ | 7.7 | 15.4 |
| 3 | 5.2 | ↓ | 5.2 | 15.6 |
| 4 | 3.96 | ↓ | 3.96 | 15.84 |
| 5 | 3.2 | ↓ | 3.2 | 16 |
| 6 | 2.7 | ↓ | 2.7 | 16.2 |

[TABLE 5] EXPECTED W=10 μm
DISPERSION(ΔW=0.4 μm)
<ESTIMATION ΔW+0.2μm>

| NUMBER OF GATES | (a) MASK-DESIGN VALUE | (b) DISPERSION (ΔW) | (c) ACTUAL GATE WIDTH | (d) SUM OF ACTUAL GATE WIDTHS |
|---|---|---|---|---|
| 1 | 10.2 | 0.4 | 9.8 | 9.8 |
| 2 | 5.2 | ↓ | 4.8 | 9.6 |
| 3 | 3.54 | ↓ | 3.14 | 9.42 |
| 4 | 2.7 | ↓ | 2.3 | 9.2 |
| 5 | 2.2 | ↓ | 1.8 | 9 |
| 6 | 1.87 | ↓ | 1.47 | 8.82 |

[TABLE 6] EXPECTED W=15 μm
DISPERSION(ΔW=0.4 μm)
<ESTIMATION ΔW+0.2μm>

| NUMBER OF GATES | (a) MASK-DESIGN VALUE | (b) DISPERSION (ΔW) | (c) ACTUAL GATE WIDTH | (d) SUM OF ACTUAL GATE WIDTHS |
|---|---|---|---|---|
| 1 | 15.2 | 0.4 | 14.8 | 14.8 |
| 2 | 7.7 | ↓ | 7.3 | 14.6 |
| 3 | 5.2 | ↓ | 4.8 | 14.4 |
| 4 | 3.96 | ↓ | 3.56 | 14.24 |
| 5 | 3.2 | ↓ | 2.8 | 14 |
| 6 | 2.7 | ↓ | 2.3 | 13.8 |

Fig.5
L MASK=1.0μm VS ACTUAL SIZE L POLY
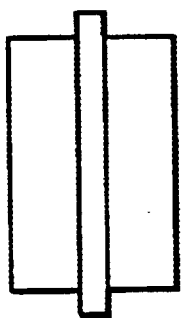
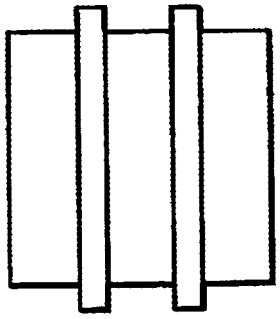
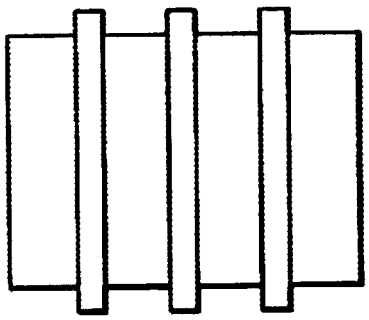
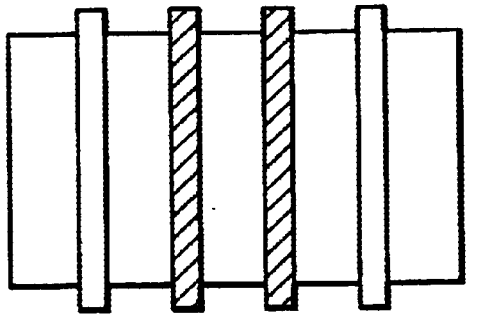
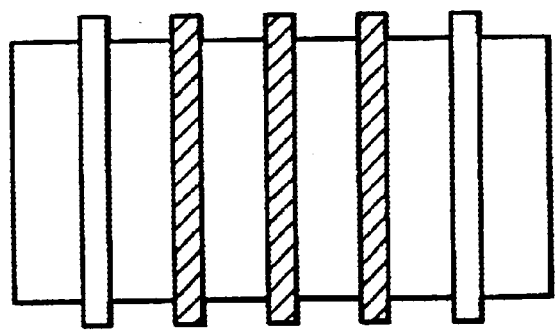

SEMICONDUCTOR DEVICE HAVING AN IMPROVED LAYOUT PATTERN OF PAIR TRANSISTORS

BACKGROUND OF THE INVENTION

1. Field of the Invention

The present invention relates to a semiconductor device, in particularly, to a layout of the semiconductor device which make it possible that electric characteristics of two transistors with the same structures as each other: so-called pair transistors, are manufactured with good manufacturing yield.

2. Description of the Related Art

A semiconductor device is manufactured by transferring a mask pattern in which a circuit configuration is laid out on a substrate to form a pattern of the configuration thereon. However, even if a mask pattern is prepared so as to satisfy circuit characteristics, an actual device manufactured on the substrate by using the pattern results in one without electric characteristics as expected when a dimensional difference due to parameter-related fluctuations in a manufacturing process arises. For example, even if masks with gate channel lengths L and gate channel widths W same as design values are prepared, actual devices formed with difference parameters from mask data when fluctuations of a manufacturing process or misalignment of masks for forming contacts are occurred.

Especially, in a case of a sense amplifier section or the like where a small current is employed, current amounts in halves of the circuit that are configured in symmetry with each other come into a state of off balance due to dimensional difference in actual layout, entails deterioration of electric characteristics and causes of defects.

Transistors (N1 and N2 of an A section of FIG. 8) that have symmetrical configurations with each other and which are required to have equal capabilities to each other have conventionally been manufactured with a drain region commonly used by two transistors as shown in FIG. 6, or alternatively with a source region commonly used by two transistors as shown in FIG. 7. Accordingly there has been arisen a problem that in a process step to manufacture such pair transistors, electric characteristics of the pair transistors become different from each other due to a dimensional difference caused by fluctuation of a manufacturing process.

This is a cause of a malfunction of a circuit, when the circuit has a symmetrical configuration as shown in FIG. 8 and halves of the circuit both operate under a difference of currents therebetween.

Further an actual width of a gate channel finally results in the sum of a mask design value (W)+a move-in of an insulating layer $\Delta W$, relative to a mask design value. The move-in of the insulating layer $\Delta W$ causes in manufacture in which the insulating layer forming on a diffused region invades the diffused region in thermal diffusion. In an actual design of a mask, dimensions of a mask pattern are determined in consideration of a move-in of an insulating layer $\Delta W$ in order to achieve high design precision. However the move-in $\Delta W$ arises in thermal diffusion is influenced by unexpected fluctuations of parameters in manufacture. Therefore it is difficult to avoid dimensional dispersion occurring beyond a design value $\Delta W$ from occurring.

As a difference of an actual width dispersion from a design tolerance $\Delta W$ is larger, a value of a channel width expected in proportion to the number of branch gates obtained division is not realized, and the number of branch gates or width of each branch gate is affected corresponding to a product of a move-in of an insulating layer $\Delta W$ * the number of branch gates. Therefore, if pair transistors in axial symmetry with each other are different in the number of branch gates from each other, it causes difference in actual channel width between the transistors completed, leading to a difference in performance therebetween as well.

Further, there arises a difference in actual gate width between an inner portion and an outer portion in a chip due to a difference in pattern packing density between an array section with a periodic pattern in which repeated gate patterns are densely packed in same intervals and a peripheral section with single patterns sparsely distributed as compared with the array section.

An additional difference in actual gate width between a densely packed section and a sparsely distributed section in the same device occurs according to a degree of light straying-in under a pattern or a condition of light reflection in exposure.

While, in Japanese Patent Laid-Open No. 5-206245 and Japanese Patent Laid-Open No. 3-116726, dummy gates are employed in order to eliminate dimensional dispersion caused by a difference in pattern packing density according to regions where gates are arranged, the published documents have disclosed a technique on a circuit configured of single transistors, but not a technique on a circuit including pair transistors. Further, in Japanese Patent Laid-Open No. 62-173810, there has only been disclosed a transistor with a gate divided into a plurality of branch gates.

SUMMARY OF THE INVENTION

Accordingly, it is an object of the invention to provide a semiconductor device having transistors with same electric characteristics.

It is another object of the present invention to provide a semiconductor device which can be manufactured while a dimensional dispersion in actual gate width according to light straying-in or light reflection in exposure is prevented from occurring and which makes it possible that transistors with same electric characteristics, such as pair transistors, are produced to high precision with good manufacturing yield.

It is another object of the present invention to provide pair transistors well suited for constructing a sense amplifier section employing a small current.

These and other objects of the present invention will be apparent to those of skill in the art from the appended claims when in light of the following specification and accompanying figures.

A semiconductor device according to the present invention includes a first transistor having a first gate put between a first source and a first drain; a second transistor arranged adjacent to the first transistor, the second transistor having a second gate put between a second source and a second drain, the second gate arranged parallel to the first gate; a first dummy gate arranged between the first drain and the second source and parallel to the first gate; a second dummy gate arranged adjacent to the first source and parallel to the first gate; and a third dummy gate arranged adjacent to the second drain and parallel to the first gate.

BRIEF DESCRIPTION OF THE DRAWINGS

FIG. 4 is tables showing states in which actual gate sizes are respectively different from design values thereof according to the number of gates;

FIG. 5 is plan views showing an example of an actual gate size corresponding to the number of gates;

DETAILED DESCRIPTION OF THE PREFERRED EMBODIMENTS

Figure 1:
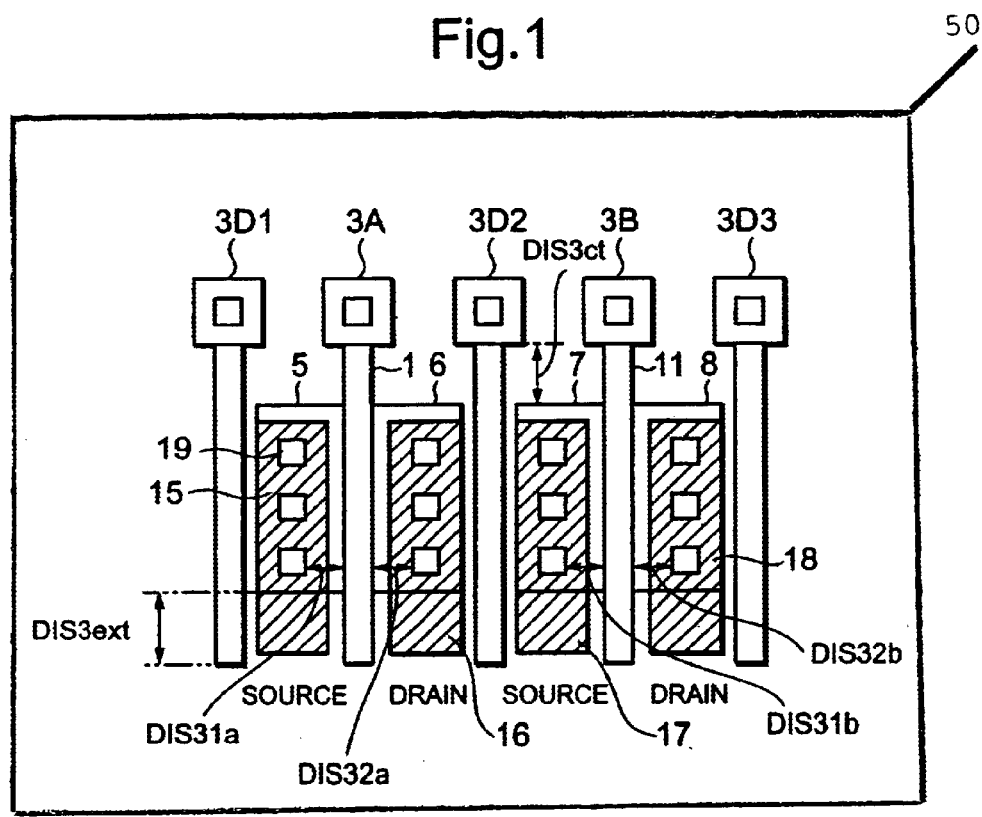
FIG. 1 is a plan view showing an embodiment of a layout of a semiconductor device according to the present invention.
Figure 2:
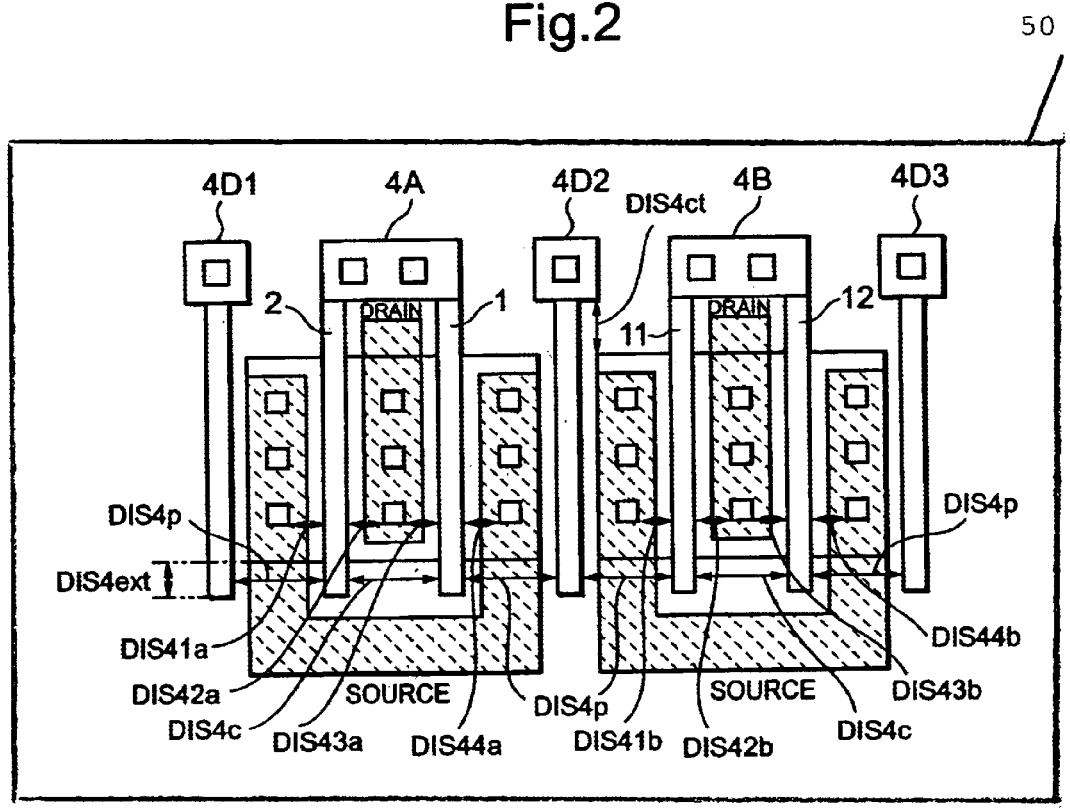
FIG. 2 is a plan view showing another embodiment of a layout of a semiconductor device according to the present invention.
Figure 3:
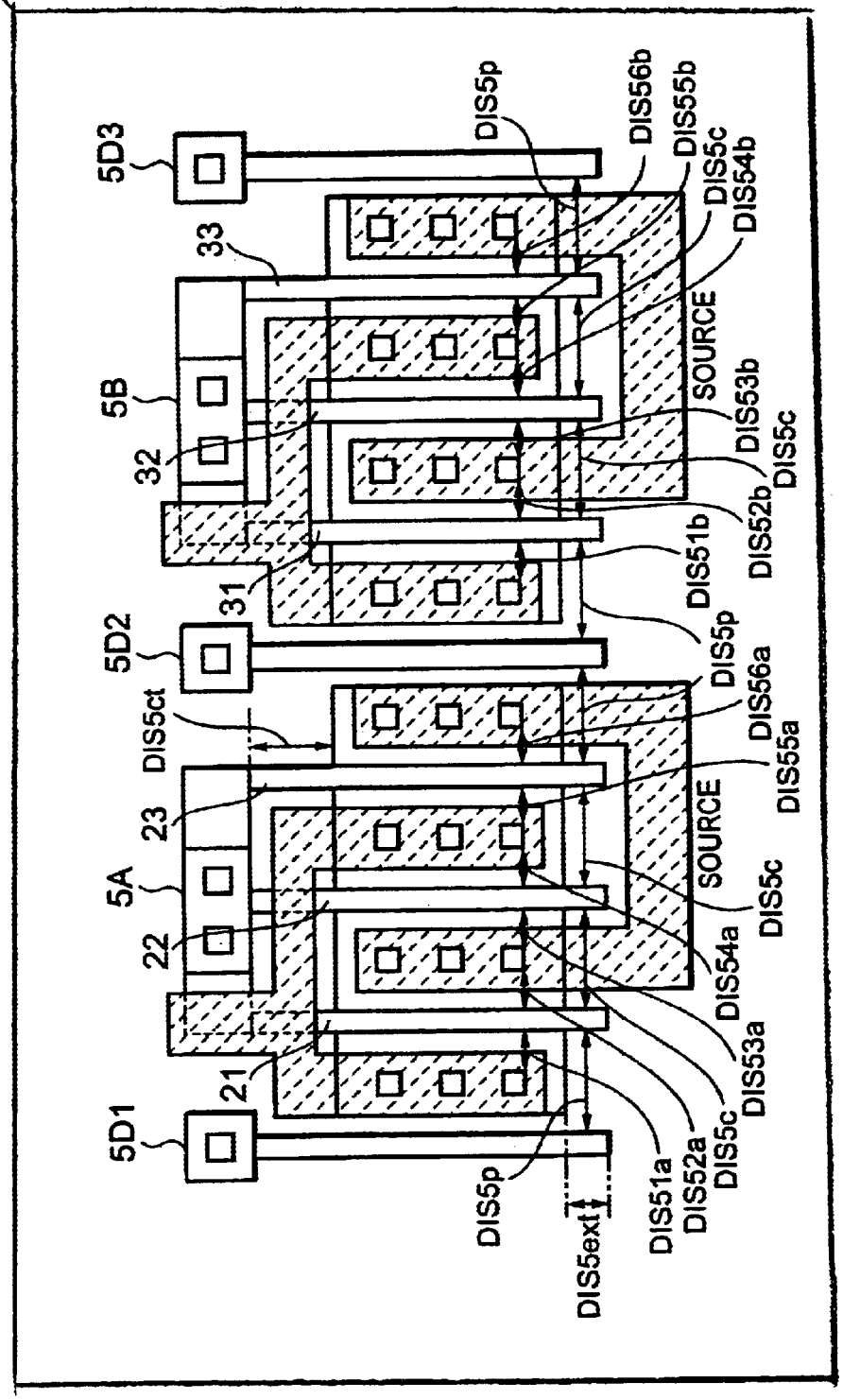
FIG. 3 is a plan view showing a further embodiment of a layout of a semiconductor device according to the present invention.

The preferred embodiments of the present invention will be described in detail hereinafter with reference to the accompanying drawing:

FIGS. 1 to 3 are views showing structures of a semiconductor device according to the present invention.

A first embodiment of the present invention is shown in FIG. 1.

In FIG. 1, there are shown pair transistors constituted of a first transistor 3A and a second transistor 3B. A dummy gate 3D2 is disposed between the transistors 3A and 3B, in parallel to a gate 1 of a transistor 3A and a gate 11 of a transistor 3B, in a place equidistant from the gates 1 and 11. Dummy gates 3D1 and 3D3 are respectively disposed on the outsides of the transistors 3A and 3B. Any adjacent pair of the gates of the transistors 3A and 3B and the dummy gates have the same distance therebetween. Further, distances DIS3ct of electrode lead-outs of the dummy gates 3D1 to 3D3 are equal to distances of electrode lead-outs of the transistors 3A and 3B. Extension distances DIS3ext of the channel sections of the dummy gates 3D1 to 3D3 are the same as those of the pair transistors 3A and 3B. A source diffusion region 5 and a drain diffusion region 6 are formed in a semiconductor substrate (not shown) with an arrangement such that the gate 1 is sandwiched between the source and drain diffusion region 5, 6. The source and drain diffusion regions 5, 6 are surrounded by element isolation regions formed in the substrate.

As shown for example in the non-limiting embodiment of FIG. 1, a dummy gate electrode may be arranged between a drain electrode of one transistor and a source electrode of an adjacent transistor on the element isolation region 50. Another dummy gate electrode may be arranged on the element isolation region 50 so that a source electrode of an adjacent transistor is sandwiched between the dummy gate electrode and the adjacent transistor. Also, a further dummy gate electrode may be arranged on the element isolation region 50 so that a drain electrode of an adjacent transistor is sandwiched between the dummy gate electrode and the adjacent transistor. The source electrode 15 is formed on the source diffusion region 5 to electrically connect with the source diffusion region 5 through contact 19 formed in an interlayer isolation layer between the source diffusion region 5 and the source electrode 15. The drain electrode 16 is formed on the drain diffusion region 6 to electrically connect with the drain diffusion region 6 through the contact 19 formed in the interlayer isolation layer.

Since the arrangement of the transistor 3A is substantially with that of the transistor 3B, the explanation of source and drain diffusion region 1, 8 and source and drain electrodes 17, 18 are omitted.

Figure 8:
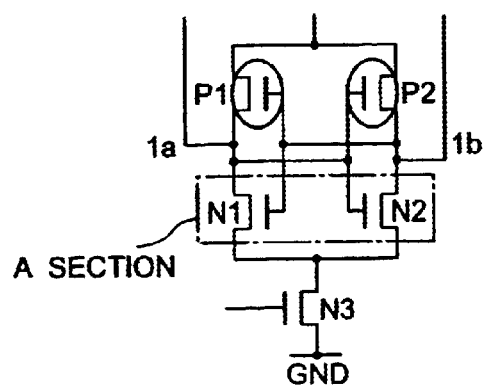
FIG. 8 is a diagram showing a circuit example for illustrating a problem in the prior art.

The transistor 3A is, for example, a N channel transistor N1 and the transistor 3B is, for example, a N channel transistor N2, as shown in FIG. 8. Therefore, the drain electrodes 16, 18 are connected in common to connect a GND potential through transistor N3.

With such dummy gates provided, the gate 1 of the transistor 3A and the gate 11 of the transistor 3B can be placed in exposure environments each with the same degree of light straying-in. Therefore, there arise no dimensional differences in manufacturing between the transistors 3A and 3B, enabling pair transistors each with a gate channel length L of the same order to be realized.

Figure 6:
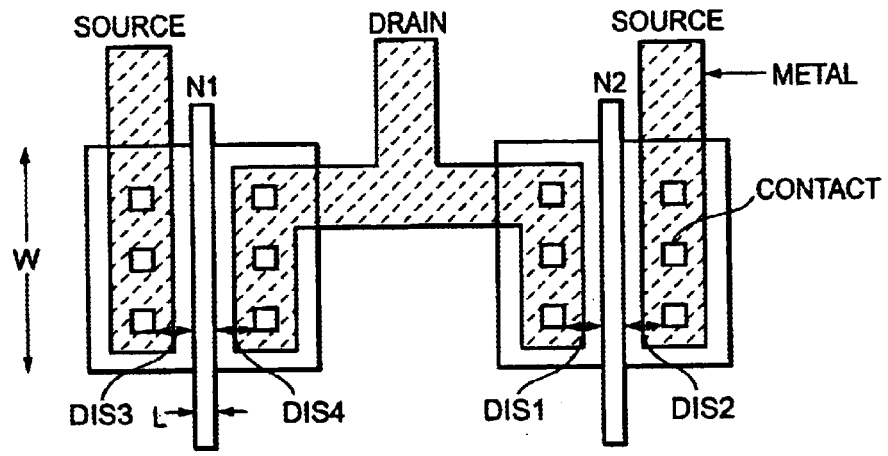
FIG. 6 is a plan view showing a layout of a conventional semiconductor device.
Figure 7:
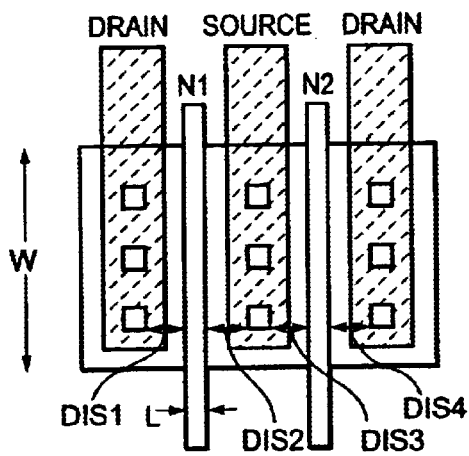
FIG. 7 is a plan view showing another layout of a conventional semiconductor device.

Furthermore, the transistors 3A and 3B each have a structure in which the source and drain regions formed on both sides of the gate are arranged in the same direction, which is different from conventional examples of FIGS. 6 and 7. In other words, the transistor 3B has the structure obtained by translating the transistor 3A while positional relations of the constituents therein are kept unchanged.

Reference marks are given to parameters associated with a semiconductor device with the structures as described above for clarity of description. In FIG. 1, distances from a channel of the transistor 3A to contacts are indicated by DIS31a and DIS32a; distances from a channel of the transistor 3B to contacts are indicated by DIS31b and DIS32b; amounts of currents each flowing through the channel and contacts of each transistor are respectively indicated by I31a, I32a, I31b and I32b. Herein, distances DIS31a and DIS32a between the channel of the transistor 3A and the contacts on both sides thereof are equal and this relation applies to the transistor 3B.

The following is a description of a case where a registration error occurs when masks are stacked in the course of manufacturing of a transistor. When a mask is misplaced on another, contacts are formed at positions displaced in one direction. Therefore, as can be seen from FIG. 6 or 7, according to a conventional technique, pair transistors had respective different distances between gate channels and contacts on either of drain sides and source sides thereof. For example, when a misplacement of a mask occurs in a direction such that a relation DIS1<,DIS4 is established on the drain sides while a relation DIS3 <DIS2 is established on the source sides, there arises a difference between a current I1 that is dependent on a distance DIS1 and a current I4 that is dependent on a distance DIS4, which currents flow from the source to the drain, although a distance between the contacts of the source and drain of the transistors N1 is not changed and this also applies to the transistor N2. Hence, there arises a difference between currents flowing though the two transistors N1 and N2.

In the present invention, however, since the two transistors have structures in which DIS31a and DIS31b thereof are equal to each other even when a mask pattern is formed with a deviation in one direction, therefore, a current I31a that is dependent on a distance DIS31a and which flows from the source to the drain of a transistor 3A is equal to a current I31b that is dependent on a distance DIS31b and which flows from the source to the drain of a transistor 3B. That is, there is no difference between the two transistors 3A and 3B in workings and a relation I31a+I32a=I31b+I32b is established and currents that respectively flow through the two transistors 3A and 3B can be made equal to each other.

Therefore, even if a mask pattern to form contacts is misplaced, no difference in characteristics between the transistors 3A and 3B occurs.

FIG. 2 shows a second embodiment of the present invention.

In FIG. 2, each of the gates of two transistors of FIG. 1 is forked into two branch gates and a structure is such that a channel of a transistor 4A is forked into two branch channels and distances DIS41a to DIS44a from the branch channels of the transistor 9A to contacts adjacent thereto are designed to be all the same as one another. Likewise, the transistor 4B has a two-way branched channel and a structure is such that distances DIS41b to DIS94b from the branch channels of the transistor 4B to contacts adjacent thereto are designed to be all the same as one another.

Dummy gates 4D1 and 4D2 of the same material and the same size as the gates 1 and 2 of the pair transistor 4A are arranged on the left and right sides thereof. Likewise, dummy gates 4D2 and 4D3 of the same material and the same size as the gates 11 and 12 of the pair transistor 4B are arranged on the left and right sides thereof. Herein the dummy gate 4D2 commonly serves the pair transistors 4A and 4B.

In the structure, a distance between the branch gates of each of the transistors 4A and 4B; and a distance between each of the branched gates and the dummy gate adjacent thereto are all same: the branch gates of the transistors and the dummy gates are equidistantly arranged between any adjacent two thereof.

In addition, an electrode lead-out distance DIS4ct of the dummy gates 4D1 to 4D3 are the same as those of an electrode lead-out of the transistors 4A and 4B. Further, extension distances DIS4ext of the channel sections of the dummy gates 4D1 to 4D3 and those of the pair transistors 4A and 4B are all the same as one another.

With such dummy gates provided, the pair transistors each with two-way branched gates can be placed in exposure environments each with the same degree of light straying-in under a pattern. Hence, there arise no dimensional differences in manufacturing between the transistors 4A and 4B, thereby enabling pair transistors with the same characteristics as each other to be produced.

Furthermore, the transistors 4A and 4B each have a structure in which the source and drain regions formed on both sides of each of the gates are arranged in the same directions like FIG. 1. Such a case where the gate of each of transistors is divided into two branch gates is nothing but a case of a structure in which the constituents of transistors are arranged in axial symmetry with each other. In FIG. 2, since a transistor has a two-way branched channel gate, the drain is disposed in a space between both end portions of the one source bent. Even if positional deviation of a mask pattern for forming contacts arises, source/drain currents of the two transistors are equal (I41a+I42a+I43a+I44a=T41b+I42b+I43b+I44b) with the result that there arises no difference in electric characteristics between the two transistors.

FIG. 3 shows a third embodiment of the present invention.

Each of the gates of two transistors in FIG. 1 is forked into three branch gates.

Since the transistors of this structure is essentially the same as those described in FIG. 1 in terms of workings, description thereof is omitted.

Transistors whose structures are in axial symmetry with each other have to have the respective same numbers of gate branches. Description will be made using Tables 1 to 6 of FIG. 4. A case is assumed where a move-in of an insulating layer ΔW=0.2 μm and corrected mask patterns ((a) in tables of FIG. 4) that are obtained by adding 0.2 μm to an expected value W of channel width are prepared.

If a width dispersion ΔW ((b) in tables of FIG. 4) arises in a diffusion process, an actual channel width W of each of the branch gates are shown as (c) in tables of FIG. 4 and sums of channel widths W of all the actual branch gates are shown as (d) in tables of FIG. 4. It is understood, as shown in Tables 1 and 2, that if an estimation ΔW is obtained in thermal diffusion, expected results can be attained even when the number of branch gates is increased.

It is understood, however, that if there arises errors in estimation as compared with an expected ΔW of move-in of an insulating layer due to parameter-related fluctuations in manufacturing, expected results of mask patterns are harder to be actually attained as the number of branch gates increases as shown in Tables 3 to 6. This means that there is a limitation in realizing a mask design value W expected according to gate division. Values shown in the tables are obtained with the minimum size=0.02 μm of a process currently employed set as the minimum size adopted in data preparation. Understanding is such that if it is desired that a capacitance of a diffused layer on the drain side is smaller, division into two or more branch gates is desired, while if it is desired that an actual width value W is closer to an expected width value W, the number of branch gates is necessary to be restricted to 2 to 3 branch gates.

As can be seen from the number of channel polysilicon stripes in arrangement and an actual channel length shown in FIG. 5, it is required that the gates of pair transistors are each divided into 2 to 3 branch gates and at least one dummy gate is provided, while such a requirement works for absorbing a change in ΔL in actual channel.

Since a semiconductor device according to the present invention has structures as described above, pair transistors with same electric characteristics can be attained even when a dimensional difference in patterning arises due to a cause in a manufacturing process.

While preferred embodiments of the present invention have been described, it is to be understood that the invention is to be defined by the appended claims when read in light of the specification and when accorded their full range of equivalent.

What is claimed is:

1. A semiconductor device including first and second transistors formed on a semiconductor chip, each having a terminal commonly connected to a node, said device comprising:

a main line of a first gate eletrode layer of said first transistor extending in a first direction;

two branches branching substantially perpendicularly from said main line of said first gate electrode layer, said two branches extending in a second direction;

a first diffusion layer of said first transistor coupled to a first contact hole;

a second diffusion layer of said first transistor coupled to a second contact hole;

a third diffusion layer of said first transistor coupled to a third contact hole;

a main line of a second gate electrode layer of said second transistor extending in said first direction, said second gate electrode layer being electrically separated from said first gate electrode layer;

two branches branching substantially perpendicularly from said main line of said second gate electrode layer, said two branches extending in said second direction;

a fourth diffusion layer of said second transistor coupled to a fourth contact hole, said fourth diffusion layer electrically coupled to said first diffusion layer as said terminal inside of said semiconductor chip;

a fifth diffusion layer of said second transistor coupled to a fifth contact hole; and a sixth diffusion layer of said second transistor coupled to a sixth contact hole, wherein said first diffusion layer, one of said branches of said first gate electrode, said second diffusion layer, the other of said branches of said first gate electrode, said third diffusion layer, said fourth diffusion layer, one of said branches of said second gate electrode, said fifth diffusion layer, the other of said branches of said second gate electrode, and said sixth diffusion layer are arranged in this order in a line extending in said first direction.

2. A semiconductor device including first and second transistors formed on a semiconductor chip, each having a terminal commonly connected to a node, said device comprising:

a main line of a fist gate electrode layer of said first transistor extending in a first direction;

three branches branching substantially perpendicularly from said main line of said first gate electrode layer, said three branches extending in a second direction;

a first diffusion layer of said first transistor coupled to a first contact hole;

a second diffusion layer of said first transistor coupled to a second contact hole;

a third diffusion layer of said first transistor coupled a third contact hole;

a fourth diffusion layer of said first transistor coupled a fourth contact hole;

a main line of a second gate electrode layer of said second transistor extending in said first direction, said second gate electrode layer being electrically separated from said first gate eletrode layer, three branches branching substantially perpendicularly from said main line of said second gate electrode layer, said three branches extending in said second direction;

a fifth diffusion layer of said second transistor coupled to a fifth contact hole;

a sixth diffusion layer of said second transistor coupled to a sixth contact hole, said sixth diffusion layer electrically coupled to said second diffusion layer as said terminal inside of said semiconductor chip;

a seventh diffusion layer of said second transistor coupled to a seventh contact hole; and an eighth diffusion layer of said second transistor coupled to an eighth contact hole, wherein said first diffusion layer, one of said branches of said first gate electrode, said second diffusion layer, another of said branches of said first gate electrode, said third diffusion layer, the other of said branches of said first gate electrode, said fourth diffusion layer, said fifth diffusion layer, one of said branches of said second gate electrode, said sixth diffusion layer, another of said branches of said second gate electrode, said seventh diffusion layer, the other of said branches of said second gate electrode, and said eighth diffusion layer are arranged in this order in a line extending in said first direction.

3. The device as claimed in claim 1, wherein said first diffusion layer and said third diffusion layer comprise sources of said fist transistor, said second diffusion layer comprises a drain of said first transistor, said fourth diffusion layer and said sixth diffusion layer comprise sources of said second transistor, and said fifth diffusion layer comprises a drain of said second transistor.

4. The device as claimed in claim 2, wherein said first diffusion layer and said third diffusion layer comprise sources of said first transistor, said second diffusion layer and said fourth diffusion layer comprise drains of said first transistor, said fifth diffusion layer and said seventh diffusion layer comprise sources of said second transistor, and said sixth diffusion layer and said eighth diffusion layer comprise drains of said second transistor.

5. The device as claimed in claim 3, further comprising:

a first dummy layer arranged between a third electrode and said fourth diffusion layer;

a second dummy layer arranged so that said first diffusion layer is sandwiched between said second dummy layer and said one of said two branches of said first gate electrode layer; and a third dummy layer arranged so that said sixth diffusion layer is sandwiched between said third dummy layer and said other of said two brunches of said second gate electrode layer.

6. The device as claimed in claim 4, further comprising:

a first dummy layer arranged between said fourth and fifth diffusion layers;

a second dummy layer arranged so that said first diffusion layer is sandwiched between said second dummy layer and said one of said three branches of said first gate electrode layer; and a third dummy layer arranged so that said eighth diffusion layer is sandwiched between said third dummy layer and said other of said three branches of said second gate electrode layer.

* * * * *